US012770819B2

(12) United States Patent
Suzuki et al.

(10) Patent No.: US 12,770,819 B2
(45) Date of Patent: Oct. 20, 2026

(54) HIGH-VOLTAGE INSULATING STRUCTURE, CHARGED PARTICLE GUN, AND CHARGED PARTICLE BEAM DEVICE

(71) Applicant: Hitachi High-Tech Corporation, Tokyo (JP)

(72) Inventors: Yasuchika Suzuki, Tokyo (JP); Shinichi Kato, Tokyo (JP); Takashi Ohnishi, Tokyo (JP); Shunichi Watanabe, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 328 days.

(21) Appl. No.: 18/559,408

(22) PCT Filed: May 17, 2021

(86) PCT No.: PCT/JP2021/018601
§ 371 (c)(1),
(2) Date: Nov. 7, 2023

(87) PCT Pub. No.: WO2022/244054
PCT Pub. Date: Nov. 24, 2022

(65) Prior Publication Data
US 2024/0242917 A1 Jul. 18, 2024

(51) Int. Cl.
*H01J 37/065* (2006.01)

(52) U.S. Cl.
CPC .................................. *H01J 37/065* (2013.01)

(58) Field of Classification Search
USPC .......................................................... 250/310
See application file for complete search history.

(56) References Cited

U.S. PATENT DOCUMENTS

| | | | |
|---|---|---|---|
| 2,485,629 A | 10/1949 | Mosthaf | |
| 2,678,346 A | 5/1954 | Garraway | |
| 3,605,076 A | 9/1971 | Dozier | |
| 10,170,273 B2 * | 1/2019 | Ichimura | H01J 37/026 |
| 2004/0094327 A1 | 5/2004 | Sato et al. | |
| 2004/0096037 A1 | 5/2004 | Tang et al. | |

(Continued)

FOREIGN PATENT DOCUMENTS

| | | |
|---|---|---|
| JP | 49-115262 A | 11/1974 |
| JP | 59-17552 U | 2/1984 |

(Continued)

OTHER PUBLICATIONS

Extended European Search Report issued in European Application No. 21940674.1 dated Sep. 9, 2025 (12 pages).

(Continued)

*Primary Examiner* — Kiet T Nguyen
(74) *Attorney, Agent, or Firm* — Crowell & Moring LLP

(57) ABSTRACT

A high-voltage insulating structure in which an electrically conductive part, to which a high voltage is applied and which extends in an axial direction, is surrounded by an insulator. An electrical resistivity of the third insulator is smaller than electrical resistivities of the first and second insulators. As for a thickness of the third insulator in the axial direction, a first thickness at an outer side farther from the electrically conductive part is less than a second thickness at an inner side closer to the electrically conductive part.

11 Claims, 6 Drawing Sheets

(56) References Cited

U.S. PATENT DOCUMENTS

| | | | | |
|---|---|---|---|---|
| 2022/0199349 A1* | 6/2022 | Kasuya | .................. | H01J 37/06 |
| 2024/0242918 A1* | 7/2024 | Sugiyama | ............... | H01J 37/07 |

FOREIGN PATENT DOCUMENTS

| | | |
|---|---|---|
| JP | 61-39353 A | 2/1986 |
| JP | 2002-270125 A | 9/2002 |
| JP | 2004-165167 A | 6/2004 |

OTHER PUBLICATIONS

International Search Report (PCT/ISA/210) issued in PCT Application No. PCT/JP2021/018601 dated Jul. 6, 2021 with English translation (4 pages).

Japanese-language Written Opinion (PCT/ISA/237) issued in PCT Application No. PCT/JP2021/018601 dated Jul. 6, 2021 with English translation (5 pages).

Partial European Search Report issued in European Application No. 21940674.1 dated Mar. 19, 2025 (14 pages).

Resubmission of document B13 “Overview of materials for Diallyl Pthalate (DAP) Molding Compound, Short Glass Fiber Filled”, The Wayback Machine, https://web.archive.org/web/20230923113908/http://www.lookpolymers.com/polym . . . , Songhan Plastic Technology Co., Ltd., Sep. 23, 2023 (5 pages).

* cited by examiner

[FIG. 1]
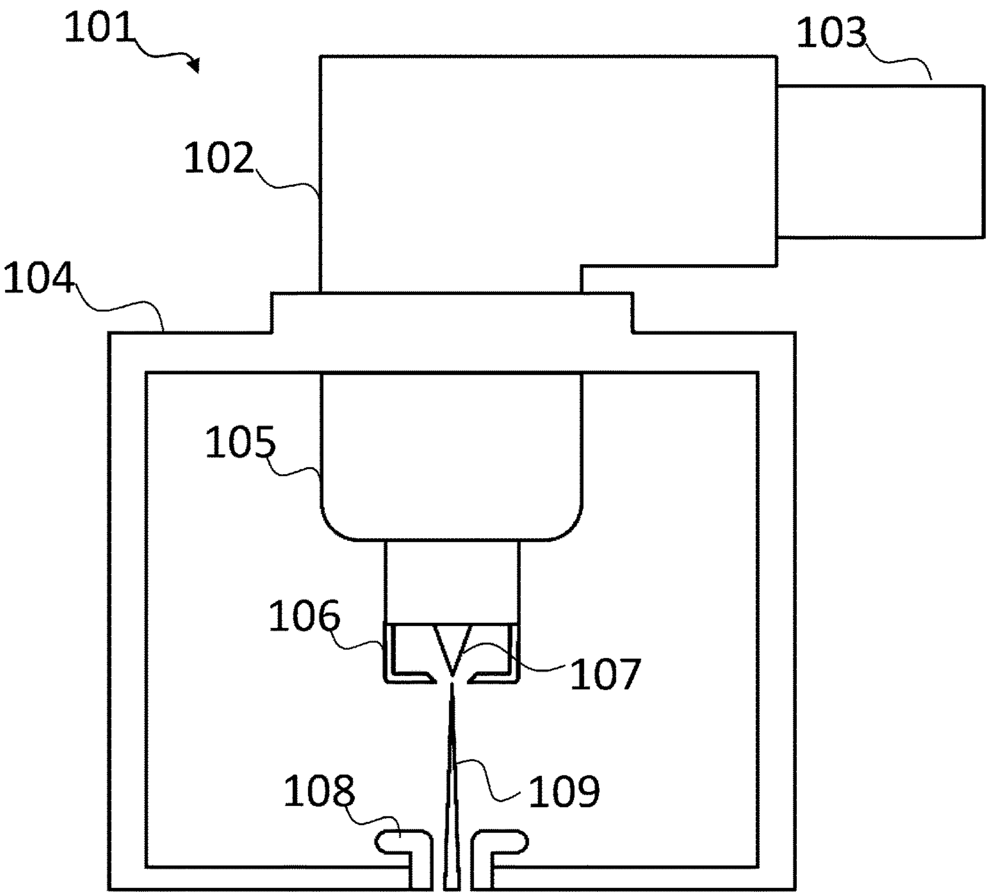
[FIG. 2]
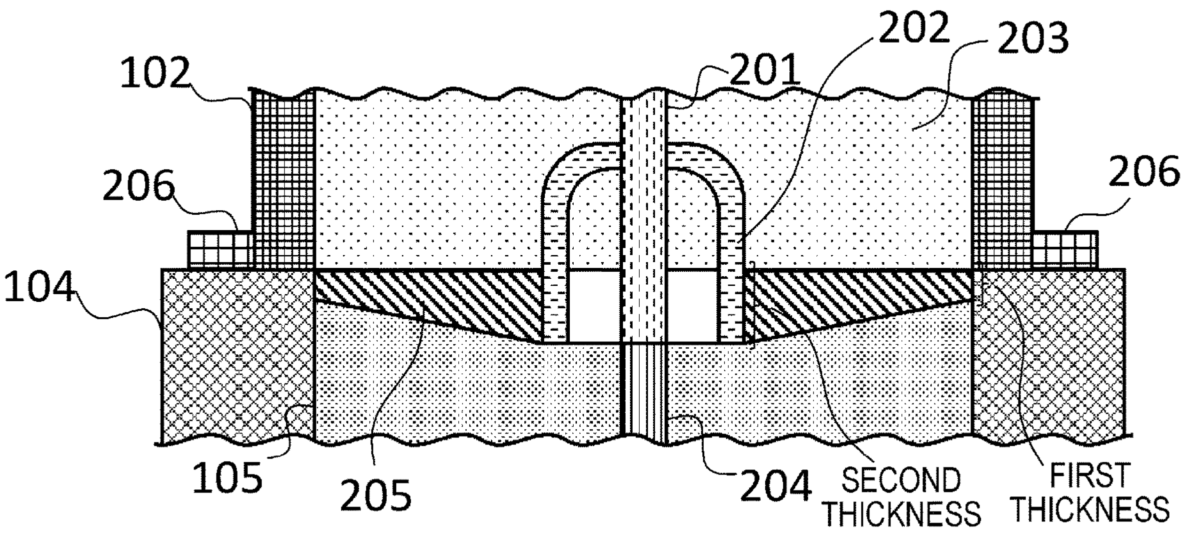

[FIG. 3]
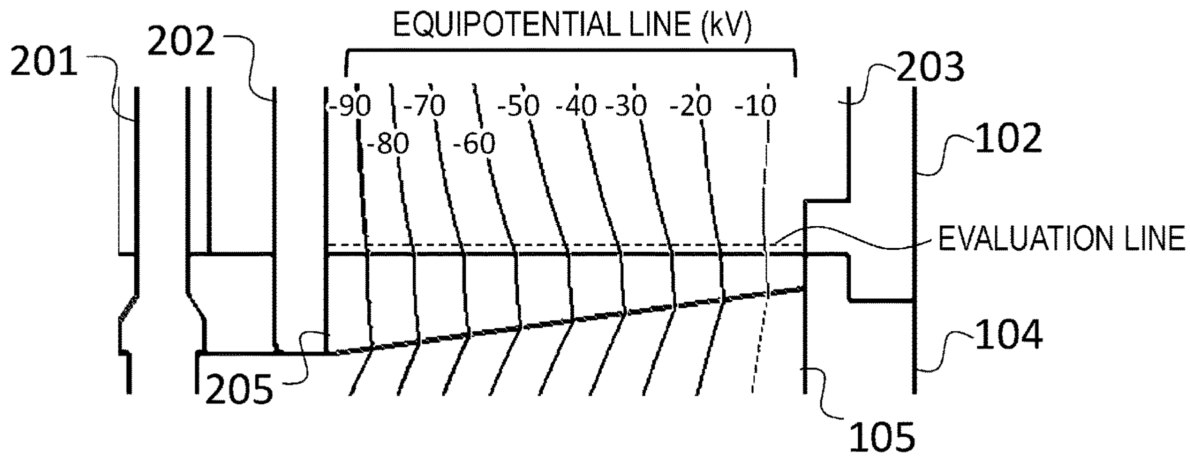
[FIG. 4]
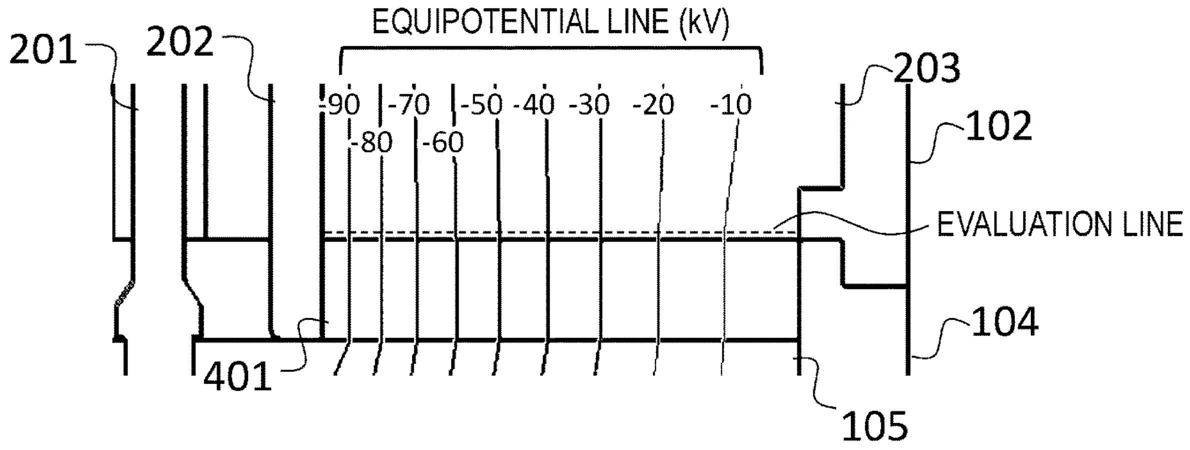

[FIG. 5]
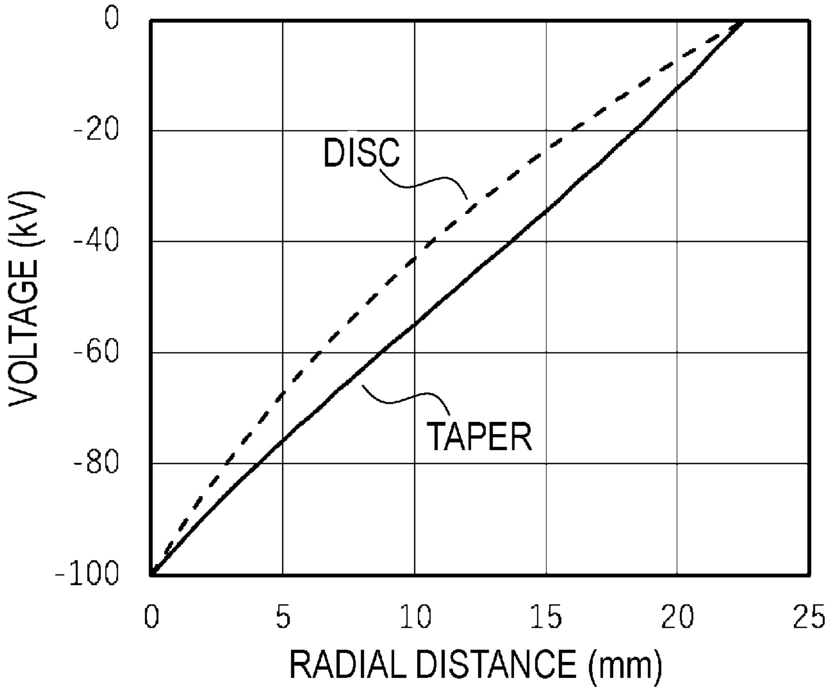
[FIG. 6]
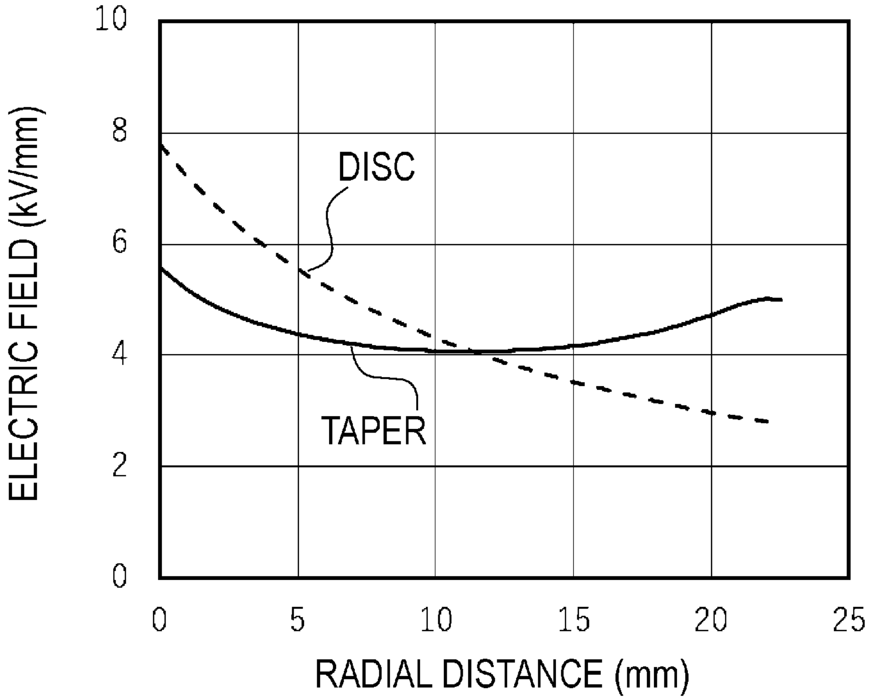

[FIG. 7]
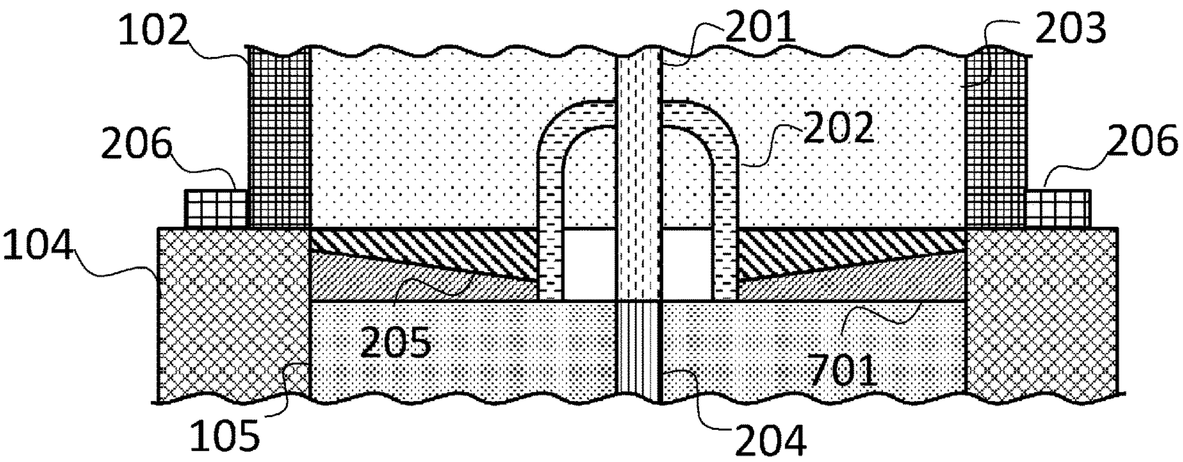
[FIG. 8]
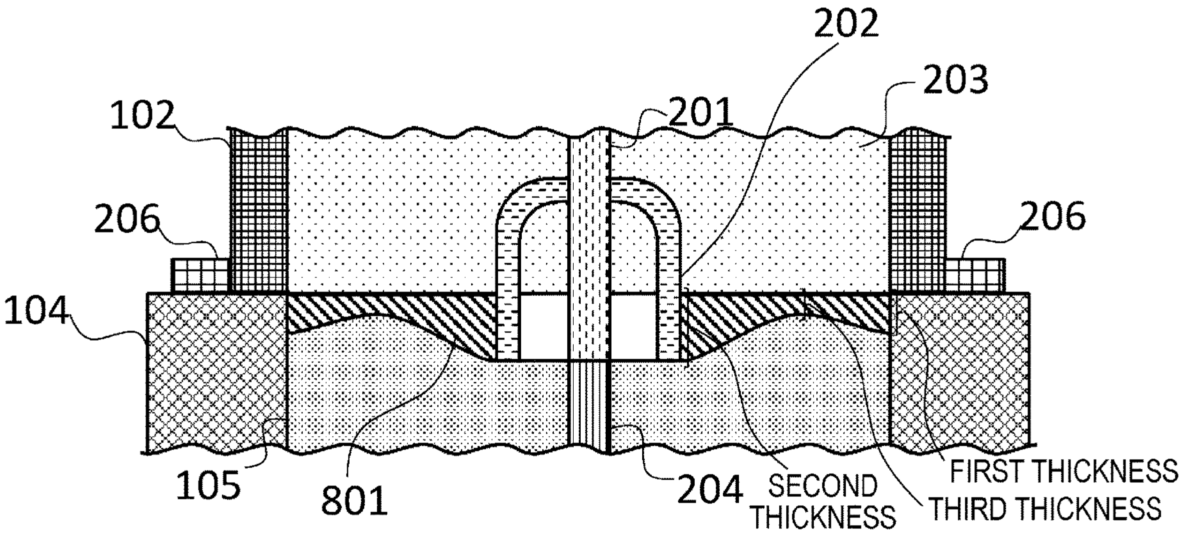

[FIG. 9]
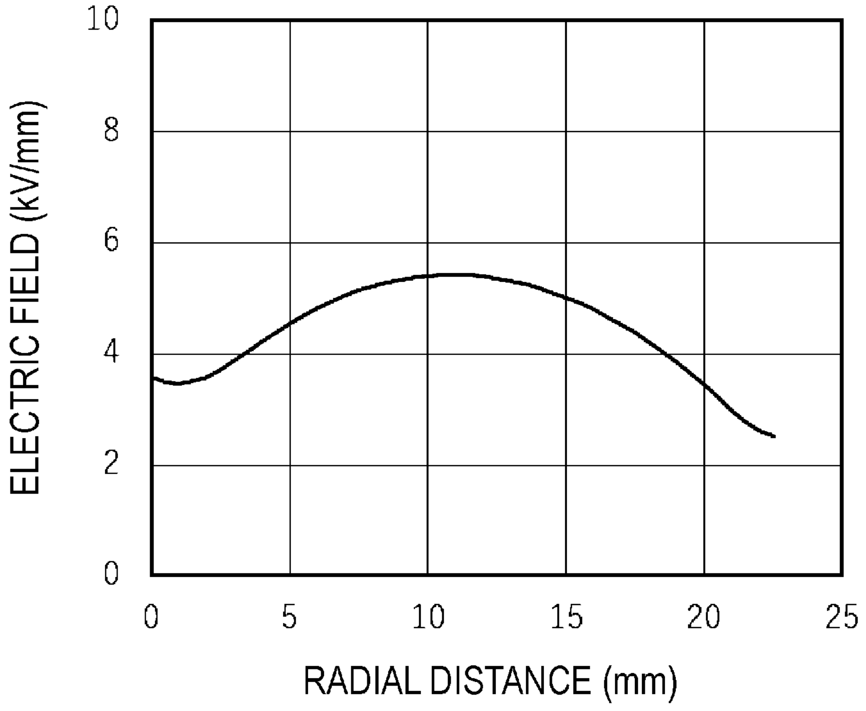

[FIG. 10]
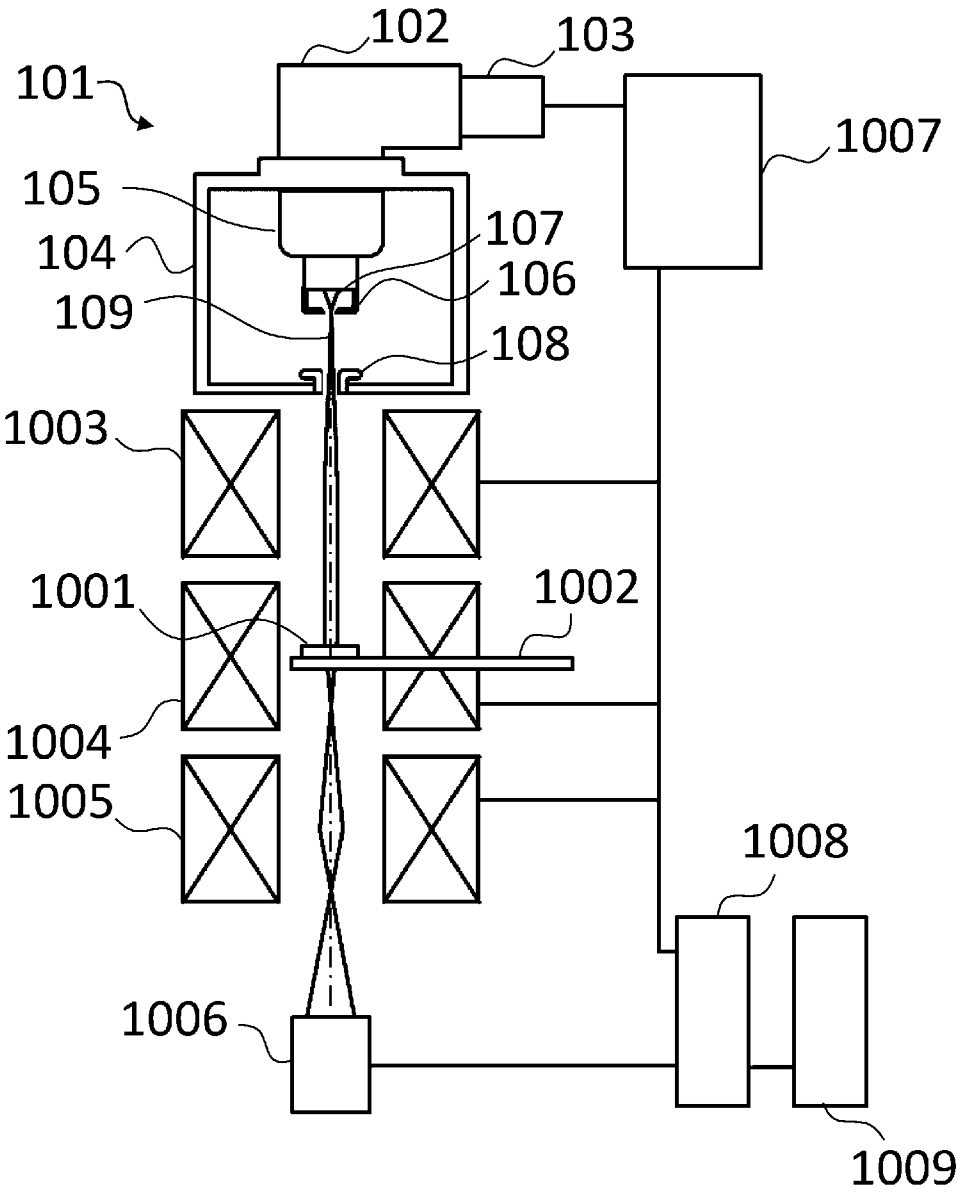

HIGH-VOLTAGE INSULATING STRUCTURE, CHARGED PARTICLE GUN, AND CHARGED PARTICLE BEAM DEVICE

TECHNICAL FIELD

The present invention relates to a high-voltage insulating structure, a charged particle gun, and a charged particle beam device.

BACKGROUND ART

In general, devices such as electron microscopes and X-ray devices that use charged particles to observe and analyze objects are equipped with a charged particle gun (generally called an electron gun) that generates electrons in the form of a beam. In such devices, a very high voltage of several kV to several hundred kV is applied to the cathode disposed inside the electron gun, so that an electron beam (charged particle beam) is accelerated and emitted toward the anode.

An HV power cable is typically used to supply such a high voltage (hereinafter abbreviated as "HV") from an HV power supply to the cathode. Here, an HV connector assembly is attached to each end of the HV power cable. In general, one end of the HV connector assembly is connected to the HV power supply, and the other end is connected to a connector portion of a housing of the electron gun.

The HV conductor having HV voltage is provided at the center of each of the HV connector assembly and the housing connector portion, and the perimeter of the HV conductor is filled with an insulating material to electrically shield the HV conductor from the ground portion. By coupling the HV connector assembly and the housing connector portion, the respective HV conductor portions are brought into electrical contact and power can be supplied to the cathode.

An insulating gasket is interposed between the connecting portion between the HV connector assembly and the housing connector portion to ensure or increase the adhesion of the connecting portion. Since the dielectric breakdown voltage of air is lower than that of solid insulating materials, discharge in the air layer between the connecting portions is a problem. Therefore, by inserting an insulating gasket, the air layer can be eliminated and a high withstand voltage can be implemented. Grease is generally applied to the surface of the gasket to further increase adhesion.

As described above, by electrically insulating the HV conductor portion having the HV voltage from the housing portion having the ground voltage, the occurrence of discharge that would destroy the electron gun is prevented. The electron gun should also prevent the occurrence of minute discharges that impair electron gun performance. Therefore, electron guns are designed with various measures to reduce the electric field.

Typically, the inside of the HV cable, and the periphery of the HV conductor, such as the connecting portion of the connector, have an axially symmetrical shape centering on the HV conductor. A radial electric field E in such an axially symmetric space follows Gauss's law given by the following Equation (1).

[Equation 1]

$$E = \frac{V_0}{\mathrm{Ln}(R_2/R_1)} \times \frac{1}{r} \tag{1}$$

In the above equation, $V_0$ is the HV voltage applied to the HV conductor, r is the distance from the central axis ($R_1 \leq r \leq R_2$), $R_1$ is the diameter of the HV conductor (HV voltage) on the inner peripheral portion, and $R_2$ is the diameter of the housing (ground voltage) on the outer peripheral portion. According to Equation (1), the electric field E is inversely proportional to the distance r from the center axis, that is, the closer to the center, the higher the electric field. As a result, the point where the electric field is maximum is positioned on the surface ($r=R_1$) of the HV conductor. Thus, the vicinity of the center where the electric field is high is a portion where the possibility of occurrence of discharge is particularly high. According to Equation (1), the electric field E decreases as the radius $R_2$ of the outer peripheral portion or the radius $R_1$ of the inner peripheral portion increases.

As a way to reduce the electric field, for example, the radius $R_2$ can be increased by increasing the size of the housing. To increase the radius $R_1$, for example, in the HV connector system disclosed in PTL 1, the HV connector assembly includes a Faraday cup disposed to surround the HV conductor. According to PTL 1, "one advantage of the present invention is that the Faraday cup provides substantial local field relief in the vicinity of HV wire junctions, thereby reducing partial discharge activity".

CITATION LIST

Patent Literature

PTL 1: JP2004-165167A

SUMMARY OF INVENTION

Technical Problem

In the HV connector system described in PTL 1, for example, by placing a Faraday cup so that the cup covers the HV conductor, the diameter of the inner peripheral portion, which is the HV voltage, is expanded, thereby reducing the concentration of the electric field to a certain extent. However, the technique described in PTL 1 still has an undesirable characteristic, that is, the closer to the center of the axis, the greater the value of the electric field.

An object of the present invention is to provide a high-voltage insulating structure, a charged particle gun and a charged particle beam device capable of reducing an electric field around an electrically conductive part to which a high voltage is applied.

Solution to Problem

The following briefly explains the outline of a representative example of the invention disclosed in the present application.

A high-voltage insulating structure according to a representative embodiment of the present invention is a high-voltage insulating structure in which an electrically conductive part, to which a high voltage is applied and which extends in an axial direction, is surrounded by an insulator, in which the insulator includes a first insulator, a second insulator positioned on the opposite side from the first insulator in the axial direction, and a third insulator positioned between first and second insulators, an electrical resistivity of the third insulator is smaller than electrical resistivities of the first and second insulators, and as for a thickness of the third insulator in the axial direction, a first thickness at an outer side farther from the electrically conductive part is less than a second thickness at an inner side closer to the electrically conductive part.

Advantageous Effects of Invention

The effect obtained by a representative example of the invention disclosed in the present application will be briefly described as follows.

That is, according to a representative embodiment of the present invention, a structure having good insulating properties against high voltage is obtained. Such a high-voltage insulating structure is capable of reducing an electric field around an electrically conductive part positioned at the center of the axis and minimizing the possibility of occurrence of partial discharge.

BRIEF DESCRIPTION OF DRAWINGS

FIG. 1 is a diagram showing a configuration of an electron gun according to a first embodiment.

FIG. 2 is a cross-sectional view showing in detail a joining portion between an HV connector and a metal housing.

FIG. 3 is a cross-sectional view showing a voltage distribution around a gasket.

FIG. 4 is a cross-sectional view showing a voltage distribution around a disk-shaped gasket without a tapered portion as a related-art example.

FIG. 5 is a graph of a voltage distribution at a joining surface between a gasket and a second insulator.

FIG. 6 is a graph of an electric field distribution at the joining surface between the gasket and the second insulator.

FIG. 7 is a cross-sectional view showing in detail a joining portion between an HV connector and a metal housing in an electron gun according to a second embodiment.

FIG. 8 is a cross-sectional view showing in detail a joining portion between an HV connector and a metal housing in an electron gun according to a third embodiment.

FIG. 9 is a graph of an electric field distribution at a joining surface between a gasket and a second insulator in the third embodiment.

FIG. 10 is a diagram showing a configuration of a transmission electron microscope as an example of a charged particle beam device.

DESCRIPTION OF EMBODIMENTS

Hereinafter, embodiments of the present invention will be described with reference to the drawings. Each of the embodiments described below is an example for implementing the present invention, and are not to be construed as limiting the technical scope of the present invention. Throughout the embodiments, the members having the same functions are designated by the same reference numerals, and the repeated description thereof will be omitted unless particularly necessary.

First, an example of a charged particle beam device commonly applied to each embodiment will be described with reference to FIG. 10. Here, FIG. 10 is a diagram showing a configuration of a transmission electron microscope as an example of the charged particle beam device.

As shown in FIG. 10, the transmission electron microscope according to the present disclosure includes an electron gun 101 that outputs an electron beam 109, a sample holder 1002 that supports a sample 1001 that is an object irradiated with the electron beam 109, an illumination lens 1003 for irradiating the sample 1001 with the electron beam 109, an objective lens 1004 for focusing on the sample 1001 and expanding the electron beam transmitted through the sample 1001, an imaging lens 1005 that forms an electron microscope image, a detector 1006 that detects the electron microscope image, a high voltage power supply 1007 that generates an acceleration voltage, a control unit 1008 that controls each of the lenses and the high voltage power supply 1007 described above, and a computer 1009 that performs various arithmetic controls. Note that, of the components forming the transmission electron microscope, the components other than the electron gun 101 are known, and so detailed description thereof will be omitted.

In the transmission electron microscope, the electron gun 101 includes a metal housing 104, and a first insulator 105, a cathode 106, an electron source 107, and an anode 108 that are provided in the metal housing 104. The electron gun 101 also includes an HV cable 103 and an HV connector 102 for introducing a high voltage (HV) output from the high voltage power supply 1007 into the metal housing 104 and applying the HV to the electron source (the cathode 106 and the electron source 107 in the present example).

Of the above, the cathode 106 and the electron source 107 form a part of the conductor positioned at the center of the axis of the electron gun 101 and are electrically insulated from the metal housing 104 forming ground voltage. The cathode 106 is electrically connected to the HV cable 103 and the HV connector 102, and is applied with a high voltage (HV) generated by the high voltage power supply 1007, to accelerate the electron beam (charged particle beam) emitted from the high-temperature electron source 107 toward the anode 108. Other configurations and features of the electron gun 101 will be described below with reference to FIG. 1.

In the transmission electron microscope shown in FIG. 10, the electron beam 109 emitted from the electron source 107 of the electron gun 101 and accelerated and passed through the position of the anode 108 is passed through the illumination lens 1003 and then irradiated onto the sample 1001. The electron beam passed (transmitted) through the sample 1001 is passed through the objective lens 1004 and the imaging lens 1005, is magnified and imaged, and then arrives at the detector 1006 so that the beam can be detected as an electron microscope image of the sample 1001.

In such a transmission electron microscope (charged particle beam device), it is important to not only prevent the occurrence of discharges that destroy the electron gun 101, but also prevent minute discharges that may impair electron gun performance. Specifically, for example, when a minute discharge is generated in the metal housing 104, there is a concern that the electron beam 109 output from the electron gun 101 and the image of the electron microscope image of the sample 1001 detected by the detector 1006 may be distorted or the resolution may be degraded.

Next, a specific configuration example of the electron gun 101 for solving the problem described above will be described below with reference to FIG. 1.

First Embodiment

FIG. 1 is a diagram showing a configuration of an electron gun according to the first embodiment. As shown in FIGS. 10 and 1, the electron gun 101 includes the HV connector 102, the HV cable 103, the metal housing 104, the cathode 106, the first insulator 105 that supports the cathode 106 and electrically insulates the metal housing 104 and the cathode 106, the electron source 107, and the anode 108.

In the electron gun 101, a negative high voltage (HV voltage) of several kV to several hundreds of kV is applied to the cathode 106 and the electron source 107, generating a voltage difference corresponding to the HV voltage with respect to the anode 108 which is the ground voltage. The inside of the electron gun 101 is vacuum, and the electron beam 109 emitted from the electron source 107 is accelerated by the voltage difference and emitted toward the anode 108 without colliding with gas molecules in the space. The HV voltage is supplied to the cathode 106 and the electron source 107 through the HV cable 103, the HV connector 102 and a conductor embedded within the first insulator 105. In general, the HV connector 102 and the metal housing 104 are in separable structures to improve workability when replacing the electron source 107 or when baking to reduce the internal pressure of the electron gun 101.

FIG. 2 is a cross-sectional view showing in detail a joining portion between the HV connector and the metal housing. As shown in FIG. 2, the HV connector 102 includes a conductor 201, a Faraday cup 202, and a second insulator 203 filled around the conductor 201 and the Faraday cup 202. A conductor 204 is electrically connected to the cathode 106 and the electron source 107 and embedded inside the first insulator 105. At the joining portion of the metal housing 104 and the HV connector 102, that is, between the first insulator 105 and the second insulator 203, a gasket 205 having an opening in the center for accommodating the Faraday cup 202 is disposed. The gasket 205 is an elastic body having a ring-shaped outer shape in a plan view, and is pressed and held between the first insulator 105 and the second insulator 203 by fastening the HV connector 102 and the metal housing 104 with fasteners 206 (for example, screws). In the present example, the gasket 205 is disposed such that an inner peripheral surface of the gasket 205 is in contact with an outer surface of the Faraday cup 202, and an outer peripheral surface (outer edge) of the gasket 205 is in contact with an inner surface of the metal housing 104. A thin layer of grease may be applied to the joining surface of the gasket 205 to enhance and improve electrical insulating performance by ensuring intimate contact with each of the insulators 105 and 203 along the joining surface of the gasket 205 and eliminating spaces between the insulators 105 and 203, and the like.

For example, one of the conductors 201 and 204 is convex-shaped and the other is concave-shaped, such that when the HV connector 102 and the metal housing 104 are connected to each other, the conductors 201 and 204 are stably contacted and electrically as the convex-shaped conductor is inserted into the concave-shaped conductor. Although not shown in FIG. 2, the conductors generally include a plurality of conductive members, and the HV voltages applied to each of the conductive members are different by several volts to several kV. The Faraday cup 202 is electrically connected to one of the conductive members. By surrounding the central conductor 201 with the Faraday cup 202, the electric field to the vicinity of the conductor 201 is shielded, thereby reducing the occurrence of unwanted electrical discharges in the vicinity of the conductor 201. In the present example, the interior of the Faraday cup 202 is filled with the second insulator 203, but in another example, an air layer may be present.

The HV voltage portion and the ground voltage portion are electrically insulated by the first insulator 105, the second insulator 203 and the gasket 205. The first insulator 105 and the second insulator 203 are made of epoxy resin or ceramic, for example, and have a high electrical insulation performance with an electrical resistivity of about $10^{14}$ to $10^{18}$ Ωcm. The gasket 205 is also a material having electrical insulation performance, and an elastic insulating material such as rubber is used to ensure and increase the adhesion at the joining portion.

Referring to FIG. 2, in the electron gun 101, the conductor 201, the Faraday cup 202 electrically connected to the conductor 201, and the conductor 204 connected to the conductor 201 at a height position substantially at the lower end of the Faraday cup 202 described above are arranged to extend in an axial direction (vertical direction in FIGS. 1 and 2) to form an electrically conductive part of the present disclosure. In the electron gun 101, an insulating structure for insulating the metal housing 104 from the high voltage applied to the electrically conductive part is configured by surrounding the electrically conductive part with various insulators.

In the first embodiment shown in FIG. 2, the insulators surrounding the electrically conductive part include the first insulator 105 positioned in a lower portion (inside the metal housing 104 in the present example), the second insulator 203 positioned above the insulator 105 (inside the HV connector 102 in the present example), and the gasket 205 positioned between the first and second insulators 105 and 203.

In other words, the second insulator 203 is positioned on the opposite side from the first insulator 105 to face the same in the axial direction, that is, in the direction in which the electrically conductive part extends. The gasket 205 is provided to be interposed between the first insulator 105 and the second insulator 203 in the axial direction (in the vertical direction).

In the first embodiment of the present disclosure, the gasket 205 serves as a third insulator and is made of a material having a lower electrical resistivity than the surrounding insulators, that is, the first insulator 105 and the second insulator 203. For example, when the electrical resistivity of the first and second insulators 105 and 203 is about $10^{14}$ to $10^{18}$ Ωcm, the gasket 205 is made of a material with an electrical resistivity lower than $10^{14}$ Ωcm. Examples of such material include chloroprene (neoprene) rubber having an electrical resistivity of $10^{10}$ to $10^{12}$ Ωcm.

Generally, according to the related art, it is believed that, from the viewpoint of high withstand voltage, the gasket interposed in the connecting portion between the first insulator 105 and the second insulator 203 should be made of a material having as high electrical resistivity as possible, and such a configuration has been used in practice.

On the other hand, in the related-art configuration described above, while it is possible to prevent a discharge due to a large current that would destroy the electron gun, it is considered difficult to prevent other discharges, that is, local or partial discharges (hereinafter referred to as "partial discharges"), which may affect the performance of the electron gun.

As a result of various studies and experiments on the structure of electron guns, the present inventors have thought the opposite the related way, that is, the inventors have found that it is better to make the electrical resistivity of the gasket lower than that of the surrounding insulators 105 and 203 to prevent the partial discharges while preventing discharge due to large current. Moreover, to obtain such an effect, the inventors have found that it is necessary to make the thickness of the gasket different at an inner diameter side and an outer diameter side as follows.

In the present disclosure, the gasket 205 is configured such that a first thickness at the outer diameter side is less than a second thickness at the inner diameter side. More specifically, the gasket 205 of the first embodiment has a tapered shape in which the thickness is continuously reduced in a radial direction from the portion with the second thickness to the portion with the first thickness. Although not shown, as another example, the gasket 205 may be configured such that the thickness decreases stepwise (for example, in a stepped or wavy cross-sectional shape) in the radial direction from the portion with the second thickness to the portion with the first thickness. Alternatively, the thickness may change in a curved line from the portion with the second thickness to the portion with the first thickness. Between the first thickness and the second thickness, there may be a flat area where the thickness does not change.

The inventors of the present invention have found that, with the configuration described above, the partial discharge generated from the conductor 201 or the Faraday cup 202 inside the metal housing 104 can be significantly prevented by the action of the gasket 205 (electrical properties of the third insulator).

As described above, according to the configuration that the gasket 205 has different thicknesses at the outer diameter side and the inner diameter side, it is desirable that the surfaces of the first insulator 105 and the second insulator 203 that come into contact with the gasket 205 are processed into shapes that follow the shape of the gasket 205. For example, in the example shown in FIG. 2, since the lower surface of the gasket 205 is a tapered sloped surface, the upper surface of the first insulator 105 is tapered. Although not shown, as another example, the upper surface of the gasket 205 may be the tapered sloped surface, and here, the lower surface of the second insulator 203 may be tapered. As yet another example, both the upper surface and the lower surface of the gasket 205 may be the tapered sloped surfaces, and here, the upper surface of the first insulator 105 and the lower surface of the second insulator 203 may be tapered.

As shown in FIG. 2, the configuration in which only one side (the lower surface side in the present example) of the gasket 205 is tapered has the advantage that the process for manufacturing the insulating structure is relatively simple.

As described above, since the surfaces of the first and second insulators 105 and 203 holding the gasket 205 (the upper and lower surfaces contacting the gasket 205) are formed into the surface shapes corresponding to the shapes of the corresponding contact surfaces (the lower and upper surfaces) of the gasket 205, the original shape of the gasket 205 can maintain the original shape even when it is pressed and held. Therefore, the gasket 205 and the insulators 105 and 203 can be brought into close contact with each other to improve electrical insulation performance.

FIG. 3 is a cross-sectional view showing a voltage distribution around the gasket. The present inventors obtained by simulation the voltage distribution around the gasket 205 in the electron gun 101 shown in FIG. 2, in other words, the voltage distribution of the minute leakage current that inevitably occurs in the insulating structure when the electron gun 101 is in operation. In FIG. 3 showing the voltage distribution of the simulation results, the end of the gasket 205 at the inner diameter side has an HV voltage (−100 kV), and the end at the outer diameter side has a ground voltage (0 kV). Between −100 kV and 0 kV, equipotential lines are shown at intervals of 10 kV. The radii of the inner and outer peripheral portions of the gasket 205 are 12.5 mm and 35 mm, respectively, and the distance from the inner peripheral portion to the outer outer peripheral portion is 22.5 mm. The first thickness and the second thickness of the gasket 205 are 1.6 mm and 4.7 mm, respectively. The electrical resistivity of the first insulator 105 and the second insulator 203 was set to 1016 Ωcm, and the electrical resistivity of the gasket 205 was set to a lower value of $10^{12}$ Ωcm, and the calculation was performed.

FIG. 4 is a cross-sectional view showing a voltage distribution around a disk-shaped gasket without a tapered portion as a related-art example. Instead of the gasket 205 described above, the present inventors placed a disk-shaped gasket 401 having a uniform thickness from the inner diameter side to the outer diameter side of the gasket 205, and obtained the voltage distribution around the gasket 401 by simulation in the same way. The thickness of the gasket 401 was 4.7 mm. Other conditions were the same as in FIG. 3.

As the comparison of FIGS. 3 and 4 shows, it can be seen that, according to the insulating structure using the gasket 205 of the first embodiment, the interval between the equipotential lines at the inner diameter side (high voltage side) is wider, whereas the interval between the equipotential lines at the outer diameter side (low voltage side) is narrower, compared to the insulating structure using the gasket 401 of the related-art configuration. As described above, by widening the interval between equipotential lines at the high voltage side, it is possible to prevent discharge due to a large current that would destroy the electron gun, and also significantly prevent partial discharge that may affect the performance of the electron gun.

FIG. 5 is a graph of voltage distribution at the joining surface between the gasket and the second insulator. That is, the graph shown in FIG. 5 represents the voltage distribution on the evaluation line indicated by the dotted line in FIGS. 3 and 4, that is, on the creepage surface where the gasket and the insulator (the second insulator 203 in this example) are joined. In the graph, the vertical axis is voltage (unit: kV). The horizontal axis is the distance (unit: mm) on the evaluation line, and the left end point of the evaluation line (end point of the gasket at the inner diameter side) is 0 mm. The solid line (taper) and the broken line (disk) in the graph are plots corresponding to the tapered gasket 205 shown in FIG. 3 and the disk-shaped gasket 401 shown in FIG. 4, respectively.

FIG. 6 is a graph of the electric field distribution at the joining surface between the gasket and the second insulator. That is, the graph shown in FIG. 6 is the rate of change of the voltage plot shown in FIG. 5, that is, the plot of the electric field distribution of the creepage surface. The vertical axis is the electric field (unit: kV/mm), and the horizontal axis is the same as in FIG. 5.

Here, the difference between the first embodiment and the related-art configuration will be described in more detail with reference to FIGS. 3 and 4 again. As shown in FIG. 4, when the disk-shaped gasket 401 is used, the interval between equipotential lines is narrower toward the inner diameter side of the gasket (especially at a voltage of −60 kV or less). This indicates that the electric field is higher toward the inner diameter side of the gasket. On the other hand, as shown in FIG. 3, when the tapered gasket 205 is used, the intervals between the equipotential lines are approximately equal, and the electric field at the inner diameter side is reduced.

The difference in effect is more clearly demonstrated in the electric field graph shown in FIG. 6. In the plot (in dashed line) of the related-art disk-shaped gasket 401 (hereinafter sometimes referred to as disk type), according to Gauss's law shown in Equation (1), the value of the electric field increases as the distance approaches the inner diameter side (0 mm) of the gasket, reaching a maximum value of 7.8 kV/mm at 0 mm. In contrast, in the plot of the tapered gasket 205 (in solid line), the electric field values are lower than the disk type at radial distances of 12 mm or less, and higher than the disk type at 12 mm or more. As a result, the electric field values at both ends (0 mm and 22.5 mm) of the gasket are almost equal, and there is a region in the central portion having a lower electric field value than the electric field values. As described above, in the configuration of the first embodiment, by reducing the difference between the maximum value and the minimum value of the electric field, that is, by smoothing the electric field distribution of the gasket in the radial direction, the maximum electric field value at the 0 mm point is reduced to 5.4 kV/mm.

The effect of reducing the electric field concentration described above can be achieved by the following characteristics of the present disclosure.

Characteristic 1: By using a material with a lower electrical resistivity than the surrounding insulator as the third insulator (gasket in the present example), a minute current (leakage current) that inevitably leaks from the electrically conductive part during operation of the electron gun preferentially flows through the third insulator (gasket).

Characteristic 2: By making the outer diameter side thickness of the third insulator (gasket) less than the inner diameter side thickness thereof, the resistance value per unit distance in the radial direction of the third insulator (gasket) is controlled to equalize the current density of the leakage current shown in FIG. 3 and the like.

As described above, according to the electron gun 101 and the transmission electron microscope of the present disclosure, by smoothing the distribution of the electric field generated over the radial direction of the third insulator (gasket), it is possible to reduce the local concentration of the electric field, thereby reducing the occurrence of undesirable partial discharges. As a resultant effect, the electric field on the surface of the third insulator (gasket) can be reduced, such that the grease applied to improve the withstand voltage performance can be removed, thereby eliminating the assembly process of applying grease, and improvement in maintainability can also be expected.

Second Embodiment

In the second embodiment of the present disclosure, modifications of each part included in the electron gun 101 will be described. Since other configurations are the same as that of the first embodiment, differences from the first embodiment will be mainly described below.

FIG. 7 is a cross-sectional view showing in detail a joining portion between an HV connector and a metal housing in an electron gun according to a second embodiment. In the first embodiment described above, the first insulator 105 and the second insulator 203 are in contact with the gasket 205 (third insulator), but one or both of the insulators 105 and 203 in contact with the gasket 205 may be replaced with a second gasket (fourth insulator).

For example, in the configuration example of the second embodiment shown in FIG. 7, a second gasket 701 as the fourth insulator is disposed between the first insulator 105 and the gasket 205. Here, the gasket 205 has a lower electrical resistivity than the surrounding insulators (the second gasket 701 and the second insulator 203 in the present example). For example, the second gasket 701 is silicone rubber having an electrical resistivity of about $10^{14}$ to $10^{18}$ Ωcm.

By placing the additional gasket as such, there is provided an advantageous effect that it is not necessary to process the insulator forming the HV connector 102 or the metal housing 104 into a tapered shape or the like, while maintaining the same effects as in the first embodiment. Therefore, cost reduction in the manufacturing process of the electron gun 101 can be achieved.

Third Embodiment

In the third embodiment of the present disclosure, a modification of each part included in the electron gun 101 will be described. Since other configurations are the same as those of the first embodiment, differences from the first embodiment will be mainly described below.

FIG. 8 is a cross-sectional view showing in detail a joining portion between the HV connector and the metal housing in the electron gun 101 according to the third embodiment. In the third embodiment shown in FIG. 8, a gasket as the third insulator is disposed at the joining portion between the first insulator 105 and the second insulator 203, as in the first embodiment described above with reference to FIG. 2.

On the other hand, a gasket 801 used in the third embodiment has a third thickness that is less than the first thickness between a second thickness at the inner diameter side and a first thickness at the outer diameter side that is less than the second thickness, as shown in FIG. 8.

The thickness of the gasket 801 between the first thickness and the third thickness and between the second thickness and the third thickness changes continuously in the radial direction. Although not shown, as another example, the gasket 801 may be configured such that the thickness between the first thickness and the third thickness and the thickness between the second thickness and the third thickness changes stepwise (for example, in a cross-sectional shape such as a stepped shape or a wavy shape) in the radial direction. Various modifications such as those described in the first embodiment can be adopted for the mode of change in thickness.

In the example shown in FIG. 8, since the lower surface of the gasket 801 is curved (the middle portion in the radial direction is concave), the upper surface of the first insulator 105 is processed to have a corresponding curved surface (the middle portion in the radial direction is convex). As another example, various modifications such as those described in the first embodiment can be adopted, or a configuration may be adopted in which a fourth insulator (second gasket) is added as described in the second embodiment.

FIG. 9 is a graph of the electric field distribution at the joining surface between the gasket and the second insulator according to the third embodiment. That is, the graph shown in FIG. 9 is a graph of the rate of change in voltage along the creepage surface of the joining portion between the gasket 801 and the second insulator 203, that is, the electric field distribution along the creepage surface, plotted the same as in FIG. 6. The first, second and third thicknesses of the gasket 801 are 1.7 mm, 4.7 mm, and 0.9 mm, respectively. Other calculation conditions are the same as in FIG. 6. The value of the electric field is 3.5 kV/mm at the inner diameter side end (0 mm) of the gasket 801, 2.6 kV/mm at the outer diameter side end (22.5 mm) of the gasket 801, and 5.4 kV/mm at the middle portion (around 10 mm) of the gasket 801. Referring to FIG. 9, it can be seen that there is a region with a higher electric field value in the middle portion than in the inner and outer end portions of the gasket 801 in the radial direction.

Therefore, according to the third embodiment, by biasing the electric field to the middle portion of the gasket where partial discharge is generally less likely to occur, it is possible to further reduce the electric field at both ends of the gasket which become relatively prone to partial discharge. In the third embodiment, although an example in which there are three extreme points of variation in the thickness of the gasket (third insulator) has been described, as another example, the gasket may be configured such that there are four or more extreme points of variation in thickness.

Note that the present invention is not limited to the first, second, and third embodiments described above, and includes various modifications. For example, the embodiments described above have been described in detail with respect to electron guns specifically adapted to the field of electron microscopy for ease of understanding of the present invention. Accordingly, the present invention is not necessarily limited to having all the configurations described herein. A part of the configuration of an embodiment can be replaced with the configuration of another embodiment, and the configuration of another embodiment can be added to the configuration of an embodiment.

The configuration of the third insulator in the embodiment described above can be applied not only to an electron gun of an X-ray device, but also to a gas insulating device described in, for example, JP2007-14070A. Specifically, the configuration of the third insulator described above can be applied to an "insulating spacer" attached to a high voltage conductor in a closed container filled with an insulating gas in gas-insulated electrical equipment. Here, the insulating gas corresponds to both the first insulator and the second insulator described above, and the third insulator need not be a plate-like member or an elastic member. From another aspect, the phases of the first insulator and the second insulator are not particularly limited and may be solid, gaseous or liquid. The phase of the third insulator is also not necessarily solid. For example, when the first insulator and the second insulator are solid, the third insulator may be liquid or gas as well as solid.

REFERENCE SIGNS LIST

101: electron gun (charged particle gun)
102: HV connector
104: metal housing
105: first insulator
201: conductor
202: Faraday cup
203: second insulator
205, 801: gasket (third insulator)

The invention claimed is:

1. A high-voltage insulating structure in which an electrically conductive part, to which a high voltage is applied and which extends in an axial direction, is surrounded by an insulator, wherein the insulator includes a first insulator, a second insulator positioned on the opposite side from the first insulator in the axial direction, and a third insulator positioned between first and second insulators, an electrical resistivity of the third insulator is smaller than electrical resistivities of the first and second insulators, and as for a thickness of the third insulator in the axial direction, a first thickness at an outer side farther from the electrically conductive part is less than a second thickness at an inner side closer to the electrically conductive part.

2. The high-voltage insulating structure according to claim 1, wherein the third insulator has a thickness decreasing continuously or stepwise in a radial direction from a portion with the second thickness to a portion with the first thickness.

3. The high-voltage insulating structure according to claim 2, wherein an electric field value of a creepage surface of a middle portion of the third insulator in the radial direction is smaller than an electric field value at the portion with the first thickness and an electric field value at the portion with the second thickness.

4. The high-voltage insulating structure according to claim 1, wherein the third insulator further includes a portion with a third thickness less than the first thickness, between the portion with the first thickness and the portion with the second thickness.

5. The high-voltage insulating structure according to claim 4, wherein a thickness from the portion with the third thickness to the portion with the first thickness and a thickness from the portion with the third thickness to the portion with the second thickness change continuously or stepwise in a radial direction.

6. The high-voltage insulating structure according to claim 5, wherein an electric field value of a creepage surface at the portion with the third thickness is higher than an electric field value at the portion with the first thickness and an electric field value at the portion with the second thickness.

7. The high-voltage insulating structure according to claim 1, wherein surfaces of the first insulator and the second insulator that are in contact with the third insulator each have a surface shape corresponding to a change in the thickness of the third insulator.

8. The high-voltage insulating structure according to claim 1, wherein the third insulator is a planar ring-shaped elastic body and is pressed and held by the first insulator and the second insulator.

9. The high-voltage insulating structure according to claim 1, further comprising a fourth insulator having a higher electrical resistivity than the third insulator between the first and second insulators.

10. A charged particle gun comprising the high-voltage insulating structure according to claim 1, wherein the electrically conductive part is a conductor for applying the high voltage to a charged particle source.

11. A charged particle beam device comprising the charged particle gun according to claim 10.

* * * * *